(12) United States Patent
Davis

(10) Patent No.: US 7,205,819 B2
(45) Date of Patent: Apr. 17, 2007

(54) ZERO-BIAS-POWER LEVEL SHIFTING

(75) Inventor: Timothy Davis, Arlington, TX (US)

(73) Assignee: VIA Technologies, Inc., Taipei (TW)

( * ) Notice: Subject to any disclaimer, the term of this patent is extended or adjusted under 35 U.S.C. 154(b) by 75 days.

(21) Appl. No.: 11/042,009

(22) Filed: Jan. 25, 2005

(65) Prior Publication Data
US 2006/0164148 A1    Jul. 27, 2006

(51) Int. Cl.
*H03L 5/00*   (2006.01)
(52) U.S. Cl. .................. 327/333; 326/63; 326/81
(58) Field of Classification Search ............... 327/333; 326/63, 68, 80, 81
See application file for complete search history.

(56) References Cited

U.S. PATENT DOCUMENTS

| | | | | |
|---|---|---|---|---|
| 5,469,080 A | * | 11/1995 | Son | 326/81 |
| 5,675,278 A | * | 10/1997 | Tanaka et al. | 327/333 |
| 6,064,229 A | * | 5/2000 | Morris | 326/81 |
| 6,480,050 B1 | * | 11/2002 | Barnes | 327/333 |
| 6,828,825 B2 | * | 12/2004 | Johnson et al. | 326/68 |
| 6,873,186 B2 | * | 3/2005 | Gion | 326/68 |
| 6,987,413 B2 | * | 1/2006 | Kawasaki et al. | 327/333 |
| 7,034,573 B1 | * | 4/2006 | Chang | 326/68 |
| 2005/0134312 A1 | * | 6/2005 | Seo | 326/81 |
| 2005/0151574 A1 | * | 7/2005 | Lin | 327/333 |
| 2006/0033530 A1 | * | 2/2006 | Seo | 326/81 |

* cited by examiner

*Primary Examiner*—Linh My Nguyen
*Assistant Examiner*—Thomas J. Hiltunen
(74) *Attorney, Agent, or Firm*—Thomas, Kayden, Horstemeyer & Risley

(57) ABSTRACT

A circuit for voltage level translation with zero static current is disclosed for interfacing devices at one supply voltage with devices at another supply voltage. The translation is achieved by using a modified current mirror circuit such that the current mirror is effectively turned off when the output reaches a steady state condition.

14 Claims, 4 Drawing Sheets

ZERO-BIAS-POWER LEVEL SHIFTING

TECHNICAL FIELD

The present invention is generally related to electronic circuits and, more particularly, is related to a system and method of voltage translation.

BACKGROUND OF THE INVENTION

Many electronics systems use multiple voltage supplies to power semiconductor devices. To enable a device powered at one voltage level to interface with a device powered at a second voltage level, it is often desirable to use a circuit to shift between the voltage levels.

Two common level shifting techniques used today are shown in FIGS. 1A and 1B. The circuits provided and herein are illustrated with MOSFETs for the sake of simplicity. However, one of ordinary skill in the art would appreciate that other types of transistors would work in these circuits and that there are trade-offs associated with using the other types of transistors. FIG. 1A involves an n-channel input circuit and a cross coupled p-channel circuit. The p-channel circuit 104, 105 and buffer 106 operate within a higher voltage range, and buffer 101 operates at a lower voltage range and n-channel transistors 102, 103 transition between a lower and higher voltage range. N-channel transistors 102, 103 are high voltage transistors with the gates operating at the lower voltage range and the drains operating at the higher voltage range. Transistors 102, 103 communicate the signal from low voltage differential buffer 101 to the high voltage range circuitry while isolating the higher voltage range signal from the low voltage range differential buffer 101. When an input is applied to the n-channel transistors 102, 103, the n-channels 102, 103 turn on one of p-channels 104, 105. The cross coupled p-channel circuit latches in the value. The source of n-channel 103 and the drain of p-channel 105 pull the input to buffer 106 rail to rail. N-channel 103 can pull to ground, and p-channel 105 pulls to the higher voltage level. The lower voltage transistors could be destroyed if they are exposed to the higher voltage range.

As an example, apply a high level input voltage (for example 1.2V) at input A of differential output buffer inverter 101 in FIG. 1A. Also assume, for this example, that Dvdd is 1.2V and Avdd is 3.3V.

If A is high, pa goes to 1.2 volts and ma is substantially zero volts. Then pa turns on n-channel 102, because pa is higher than the turn-on threshold voltage (0.5 v) of n-channel 102 such that some current is drawn from drain to source.

As n-channel 102 turns on, ma is at substantially zero volts so n-channel 103 is turned off. When n-channel 102 is turned on and n-channel 103 is turned off, the drain of n-channel 102 is pulled down to a value near Gnd which will turn on p-channel 105 since a p-channel transistor turns on when the gate voltage is lower than the source. Meanwhile, n-channel 103 is off so that the drain impedance is very high. This causes the drain voltage of p-channel 105 and the input of buffer 106 to rise. Since p-channel 105 is on, p-channel 104 begins to be turned off.

If p-channels 104, 105 and n-channel 102, 103 are designed with the appropriate ratio, the drain of n-channel 102 will go to ground, and p-channel 105 will be turned on harder and harder. This will pull the drain of n-channel 103 higher and higher which sets p-channel 104 closer to off. Since the drain of n-channel 103 is not pulled low, p-channel 105 pulls the input of buffer 106 high.

The final steady state condition in this example has the drain of n-channel 102 at ground and the drain of n-channel 103 at Avdd of 3.3 volts. This signal is sent to buffer 106 which drives the output at Y to 3.3V.

Conversely, when A goes low to 0 volts, pa now is at ground, ma is at 1.2 volts and the circuit achieves the opposite result. N-channel 103 is dominant when n-channel 102 is turned off. The drain of n-channel 103 is pulled to ground and the output at Y is low.

This circuit generally works well because there is no situation where both p-channel 104 and n-channel 102, or p-channel 105 and n-channel 103 are on at the same time. So no "bias current" travels between Avdd to Gnd in a steady state condition. "Bias current" is an undesirable but necessary current associated with a circuit structure and is often independent of manufacturing process. "Leakage current," on the other hand, is an undesirable current associated with a manufacturing process. Generally leakage current cannot be eliminated through circuit techniques. There is zero bias power consumption in the steady state because no current is able to pass between the two voltage rails. There is still leakage current associated with the circuit in FIG. 1A; but this current is negligible in most applications.

A problem with this circuit is that since Dvdd and Avdd are from different voltage sources, they are usually derived from different circuitry. The operation of the circuit depends on n-channel 103 and p-channel 105 having the proper ratio. When n-channel 103 is switched on to turn p-channel 105 off, n-channel 103 has to be strong enough to overcome the previous latching of p-channel 104 and p-channel 105. The drive strength of n-channel 103 has to be able to overcome the drive strength of p-channel 105. To overcome p-channel 105, the gate of p-channel 104 will be pulled to ground which will turn on p-channel 104 and will pull the gate of p-channel 105 high, turning it off. To initiate this operation, n-channel 103 has to be able to overcome p-channel 105 when it is turned on. In the bias curves of a MOSFET transistor, the drive strength is related to its on-state resistance, which is based on its gate to source voltage.

The gate drive of p-channel 105 is at ground. Avdd is at 3.3 volts. The difference between those is 3.3 volts. That gate drive has to be counteracted by ma which is only 1.2 volts. So there is one transistor with a gate drive of 3.3 v and another transistor with a gate drive of 1.2 v.

Typically, the physical size of the transistor with the 1.2 v drive is increased such that it can overcome the 3.3 v drive due to the increased transistor area. Although the 1.2V-gate-driven n-channel transistor can be sized to compensate for a 3.3V-gate-driven p-channel transistor under typical conditions, the compensation may not be maintained as operating and manufacturing conditions vary. A supply voltage may vary up to 10%, and the 1.2 v supply will often vary independently from the 3.3 v supply. N-channel and p-channel devices are created from different materials and processes, and these different materials have temperature and manufacturing variations that are not correlated with one another. Furthermore, as variations from typical conditions arise, n-channel transistor and p-channel transistor mismatches introduce signal distortion due to unmatched rising and falling propagation delays.

A second circuit method for voltage level translation as shown in FIG. 1B involves a current mirror formed by p-channel 154 and p-channel 155. The gate of p-channel 154 is tied to the drain of p-channel 154, making it a diode connected transistor. The gates of p-channel 154 and p-channel 155 are also connected, so the current drawn through p-channel 154 provides the gate bias voltage for both p-channels 154 and 155. The sources of p-channels 154 and 155 are also tied to the same node (Avdd), and the transistors are the same size, same type, and have the same layout. Therefore, p-channel 155 will have the same drain current that p-channel 154 has.

Whenever n-channel 152 is on, its drive current also appears on p-channel 154 due to the series connection. Since p-channel 154 and p-channel 155 form a current mirror, the drive current of p-channel 155 matches that of n-channel 152. If n-channel 152 and n-channel 153 are also matched, the rising and falling currents that drive the input of buffer 156 will be matched.

The circuit in FIG. 1B is driven with the same differential low voltage circuit as in FIG. 1A. If signal A is high (1.2V), signal pa is at 1.2 volts and ma is at substantially zero volts. In this situation, n-channel 153 is off completely. The drain of p-channel 155 is pulled up to Avdd with a strength equal to that of n-channel 152. When the input switches state, n-channel 153 has the same strength as n-channel 152. When n-channel 152 is turned off, p-channel 155 has no drive and n-channel 153 can easily pull down to ground.

Because p-channel 155 will always have the same drive as n-channel 152 due to the p-channel current mirror, and since n-channel 152 and n-channel 153 can be easily matched with similar bias, layout geometry, and material construction, the rise and fall drive to buffer 156 is matched. Matching rise and fall drive eliminates distortion in the signal propagated from A to Y by providing matched rising and falling propagation delays.

Since p-channels 154 and 155 are both biased with reference to Avdd, the matching properties of the p-channel current mirror are independent of Avdd variation. Since both matched n-channels 152 and 153 are driven by Dvdd circuitry, their matching properties are independent of Dvdd. However, when n-channel 152 is on, steady-state bias current flows between transistors 152 and 154. Whereas the signal integrity features of the circuit of FIG. 1B are an improvement from those of the circuit in FIG. 1A, the steady-state bias current makes the circuit of FIG. 1B undesirable for low-power applications.

The circuit of FIG. 1A has zero-bias current, but mismatched rise and fall times on the output. The circuit of FIG. 1B has matched rise and fall times but high bias current.

Thus, a heretofore unaddressed need exists in the industry to address the aforementioned deficiencies and inadequacies.

SUMMARY OF THE INVENTION

Embodiments of the present invention provide a system and method for interfacing devices with different voltage supplies. Briefly described, in architecture, one embodiment of the system, among others, can be implemented as follows: an input buffer, and output buffer, a current mirror, a differential input pair, and a bias removing circuit.

An embodiment of the present invention can also be viewed as providing methods for interfacing devices with different voltage supplies. In this regard, one embodiment of such a method, among others, can be broadly summarized by the following steps: setting an output voltage with a current mirror and differential input pair, and removing the current path from the current mirror.

Other systems, methods, features, and advantages of the present invention will be or become apparent to one with skill in the art upon examination of the following drawings and detailed description. It is intended that all such additional systems, methods, features, and advantages be included within this description, be within the scope of the present invention, and be protected by the accompanying claims.

BRIEF DESCRIPTION OF THE DRAWINGS

Many aspects of the invention can be better understood with reference to the following drawings. The components in the drawings are not necessarily to scale, emphasis instead being placed upon clearly illustrating the principles of the present invention. Moreover, in the drawings, like reference numerals designate corresponding parts throughout the several views.

DETAILED DESCRIPTION

Disclosed herein are systems and methods for voltage level shifting with zero bias current. To facilitate description of the inventive systems, an example system that can be used to implement the systems and methods for voltage level shifting with zero bias current is discussed with reference to the figures. Although this system is described in detail, it will be appreciated that this system is provided for purposes of illustration only and modifications are feasible without departing from the inventive concept.

Referring now and in more detail to the drawings in which like numerals indicate corresponding parts through the several views, this disclosure describes a zero bias power voltage level shifting system. It details how the system is configured and how it operates. Of course, a variety of alternative embodiments and implementations will be appreciated from the exemplary embodiment described herein, consistent with the scope and spirit of the present invention.

Figure 2:
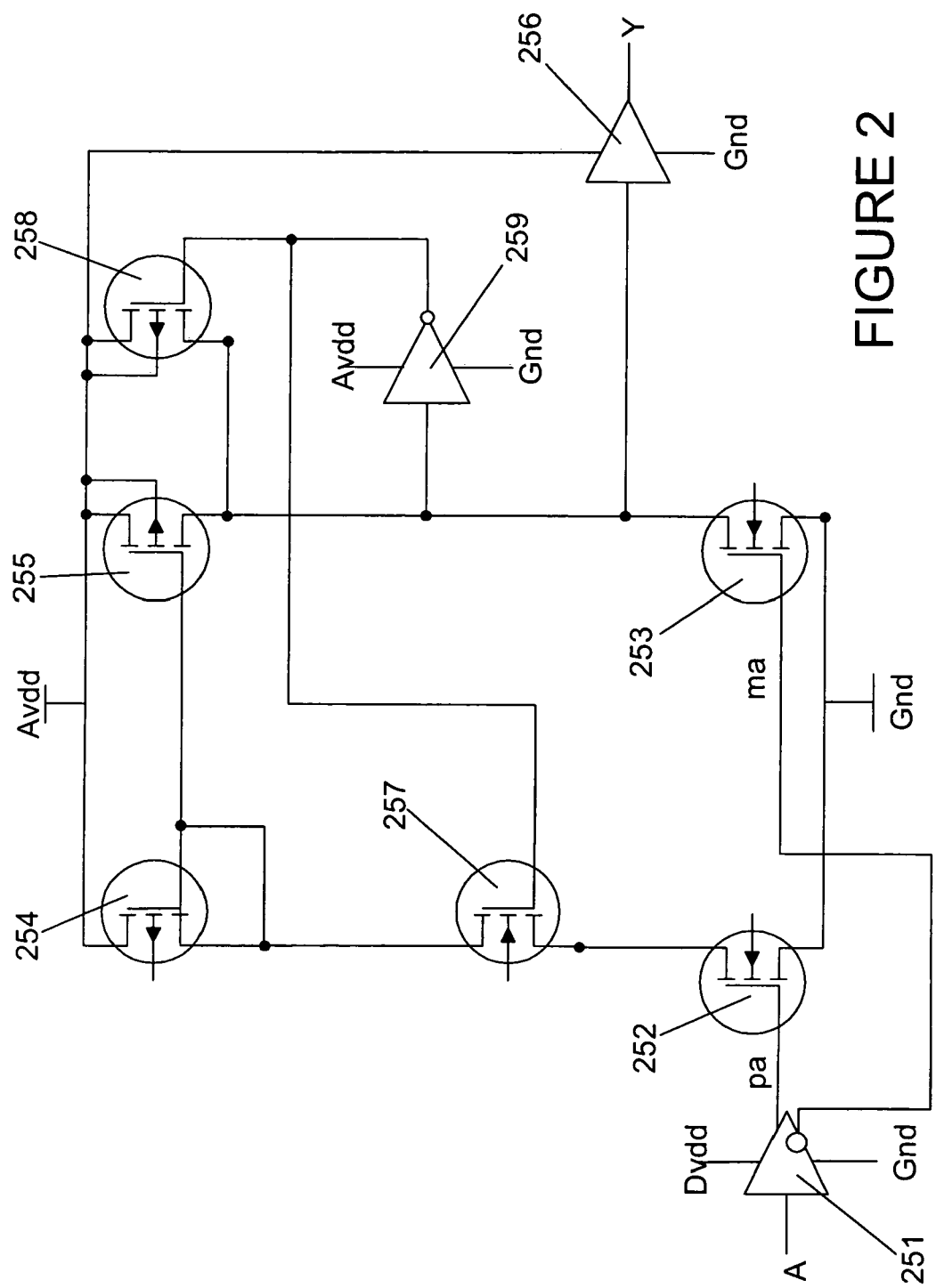
FIG. 2 is a component diagram of an exemplary embodiment of a zero-bias-current level shifting circuit.

FIG. 2 is a component diagram providing an exemplary voltage level shifting circuit with zero-bias current. One of ordinary skill in the art will recognize that the embodiments disclosed do entail some leakage current, and that zero-bias current (as that term is used herein) is not exactly zero, but substantially zero. However, for simplicity, the term zero-bias current will be used.

Figure 1A:
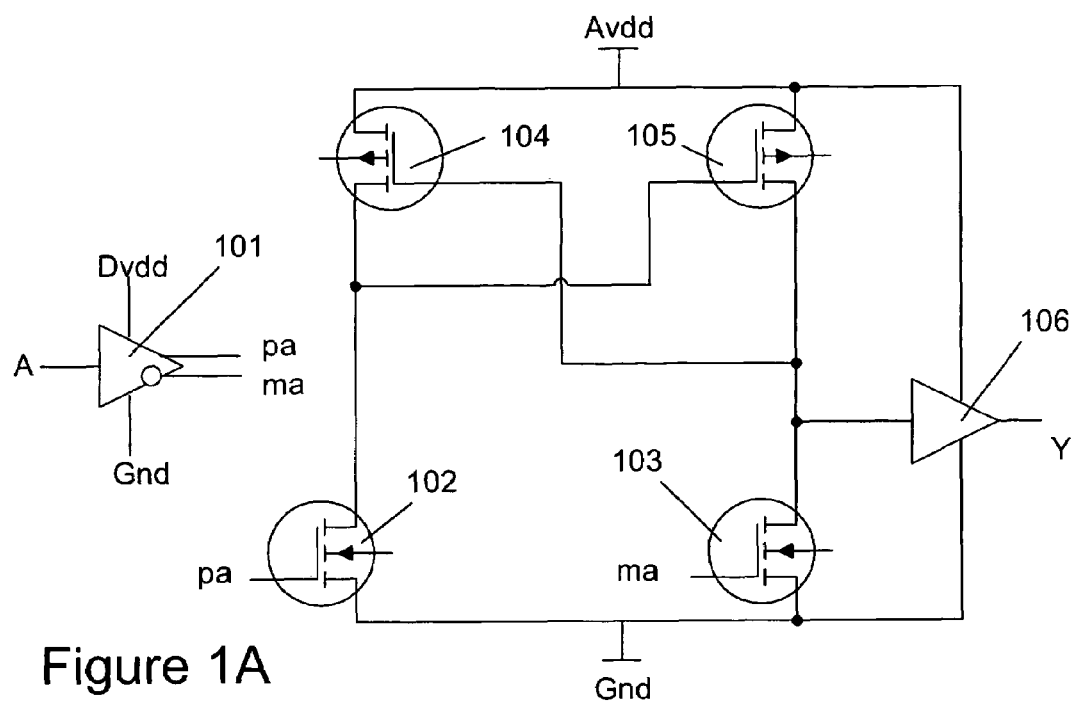
FIG. 1A is a component diagram of a first level shifting circuit as known in the prior art.
Figure 1B:
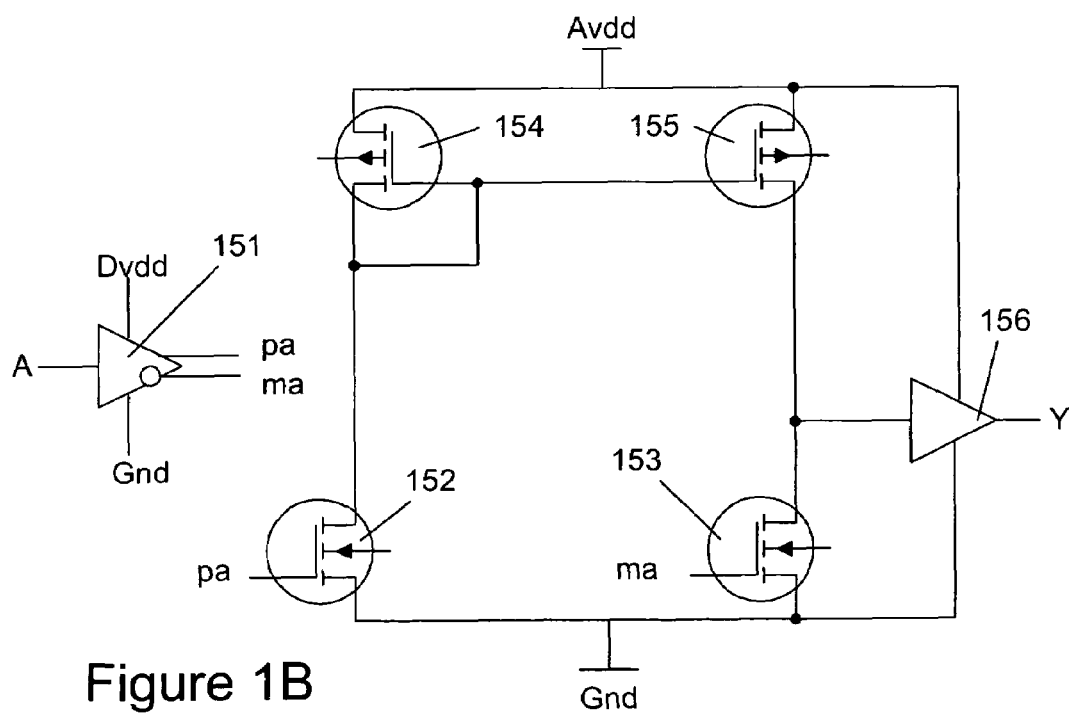
FIG. 1B is a component diagram of a second level shifting circuit as known in the prior art.

In FIG. 2, an exemplary circuit is provided in which the current mirror configuration of FIG. 1B is modified with one n-channel transistor 257, one p-channel transistor 258 and inverter buffer 259. Therefore, the circuit in FIG. 2 has the same matched drive properties of FIG. 1B, in particular the drives of p-channel 255 and n-channel 253.

An exemplary embodiment for voltage level translation as shown in FIG. 2 involves a current mirror formed by p-channel 254 and p-channel 255. The gate of p-channel 254 is tied to the drain of p-channel 254, making it a diode connected transistor such that whatever current is drawn through p-channel 254 is also present on the gate of p-channel 254. The gates of p-channel 254 and p-channel 255 are also connected, so the same current drawn through p-channel 254 also provides a gate voltage on p-channel 255. The sources of p-channels 254 and 255 are also tied to the same node (Avdd), and the transistors are the same size, same type, and have the same layout. Therefore, p-channel 255 will have the same drive power that p-channel 254 has.

If the circuit of n-channel 257, p-channel 258 and inverter buffer 259 is disregarded, since n-channel 252 and n-channel 253 are also matched, whenever n-channel 252 is on, its drive current will be mirrored as the drive current of p-channel 254. Since p-channel 254 and p-channel 255 form a current mirror, p-channel 255 drives at the same strength that n-channel 252 drives.

The circuit in FIG. 2 is driven with the same differential low voltage circuit as in FIG. 1B. Signal pa is at 1.2 volts and ma is at substantially zero volts. In this situation, n-channel 253 is off. The source of p-channel 255 is pulled up to Avdd with a strength equal to that of n-channel 252. When the input switches state, n-channel 253 has the same strength as n-channel 252. When n-channel 252 is turned off, p-channel 255 has no drive and n-channel 253 can easily pull down to ground. P-channel 255 will always have the same drive as n-channel 252 because its drive current is being mirrored through the current mirror.

This operation is independent of Avdd. Since the two legs are matched independent of the high voltage supply (Avdd), the result is independent of Dvdd. However, since p-channel 254 is a diode connected transistor, bias current will flow in either the leg consisting of transistors 252, 254 or the leg consisting of transistors 253, 255, where the drains of transistors 252, 253 are connected to the low-side of the second supply rails, or GND in this embodiment. As in FIG. 1B, this circuit, without n-channel 257, p-channel 258, and buffer 259, would not be conducive to a battery powered application due to the bias current.

However, the circuit including n-channel 257, inverter buffer 259, and p-channel 258 functions to turn off the current mirror circuit after it achieves a steady state so that no bias current is used. In one example, signal A is low, driving pa low and ma high. Signal ma turns n-channel 253 on and pulls the input of inverter buffer 259 low. The output of inverter buffer 259 goes high and p-channel 258 is turned off because its gate is high. N-channel 257 is on because its gate is high. So, in this state, n-channel 257 acts as a short, and p-channel 258 is off as if it is an open circuit. N-channel 252 is off; so no bias is supplied to the p-channel current mirror consisting of transistors 254 and 255, which are also off. Buffer 256 translates the low voltage at its input to a low voltage at output Y. No bias current is consumed in this steady-state condition.

In this state, the circuit of FIG. 2 is functionally equivalent to the circuit in FIG. 1B. When signal A transitions from low to high, transistor 253 turns off while transistor 252 turns on and energizes the current mirror. The current mirror drives the inputs of inverter buffer 259 and buffer 256 from low to high and momentarily consumes bias current as in the circuit of FIG. 1B. However, in the circuit of FIG. 2, buffer 256 has a lower threshold and switches first to the desired state. The input threshold of inverter buffer 259 is set to a higher threshold and thus switches low after buffer 256 activates. The low output of inverter buffer 259 latches the output of the current mirror high by turning on transistor 258 and simultaneously breaks the bias path of the current mirror as it turns off transistor 257.

The current mirror of p-channel 254, 255 is now effectively removed from the circuit, and no bias current flows. The output of buffer 256, which was set prior to the turning off of the current mirror, does not change state until the inputs of n-channel 252, 253 change.

As the inputs to buffer 256 and inverter buffer 259 go from low to high, first, buffer 256 sets the output of the circuit for all the circuitry downstream. The threshold of inverter buffer 259 is a little higher than the threshold of buffer 256. So, after the output of buffer 256 is set, inverter buffer 259 switches and the circuit comprising elements 257, 258, 259 removes the bias from the current mirror as shown above.

The current mirror removal circuitry is only operative when input A switches from low to high. When input A switches from high to low, signal pa goes to 0 volts and signal ma goes to 1.2 volts. Transistor 253 overpowers the latching function of weak p-channel 258, causing the input of inverter buffer 259 to fall. The output of inverter buffer 259 goes high, completely turning off latching p-channel 258. The signal at the drain of transistor 253 falls further, driving the input of buffer 256 low. Transistor 257 has been turned on allowing access to the biasing node of the current mirror, but transistor 252 has been turned off in this state. Since zero bias current is supplied to the current mirror, it consumes no power. The circuit of FIG. 1B also does not consume bias current in the state where input A is low, but does consume current to bias the current mirror and sustain internal signal levels when input A is high.

Figure 3:
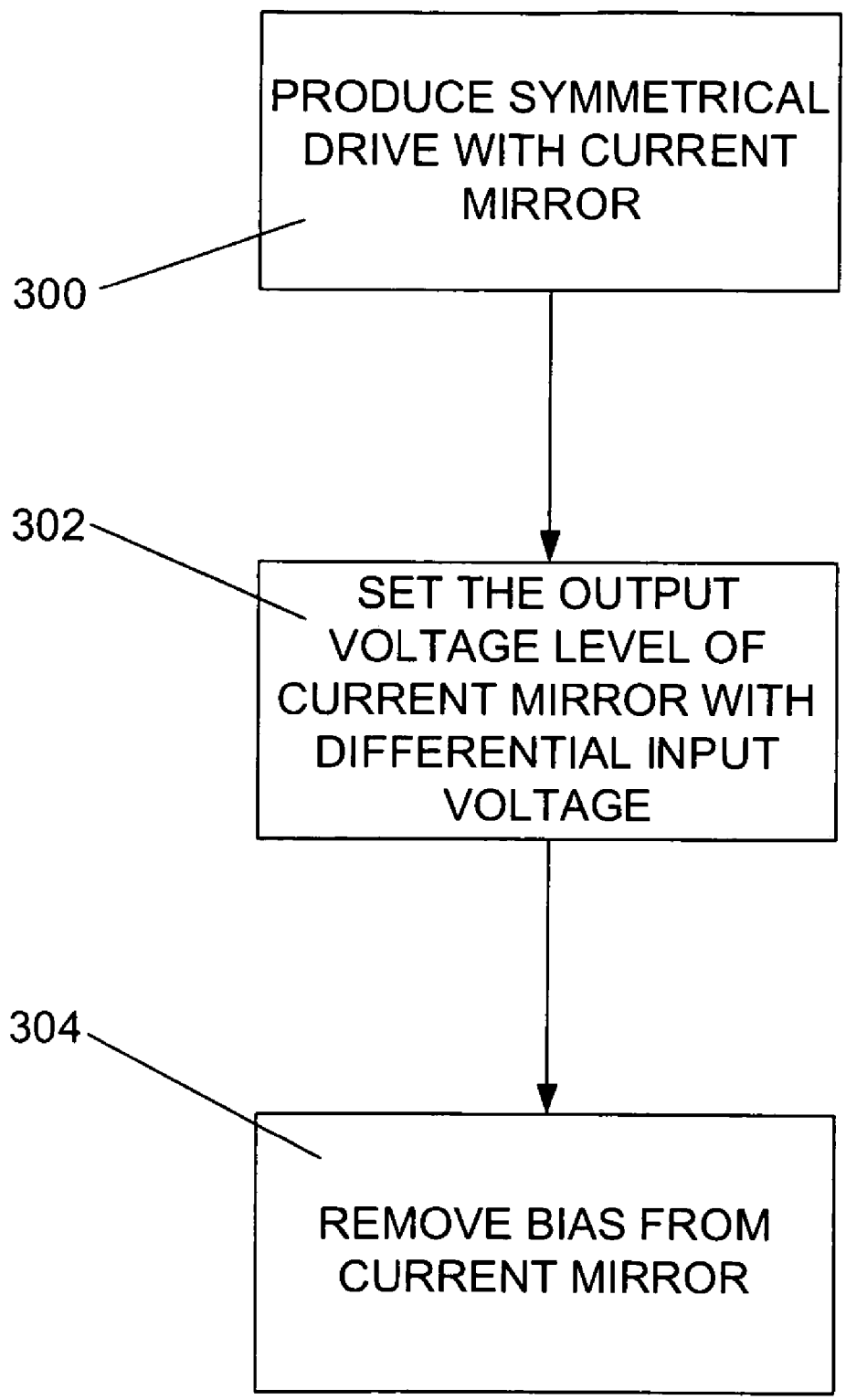
FIG. 3 is a flow chart of an exemplary embodiment of the zero-bias-current level shifting circuit provided in FIG. 2.

The exemplary embodiment has combined the current mirror functionality with a mechanism to allow the bias current to the current mirror to be turned off after it switches. As shown in the flow chart of FIG. 3, in step 300, a symmetrical output drive is achieved with a current mirror, allowing for substantially similar transition time for both low-to-high and high-to-low transitions. In step 302, the output voltage level of the current mirror is set by a differential voltage applied to a differential pair of transistors communicatively coupled to the current mirror. After a steady state output condition is achieved, the bias is removed from the current mirror in step 304, such that the current mirror consumes no more power.

Figure 4:
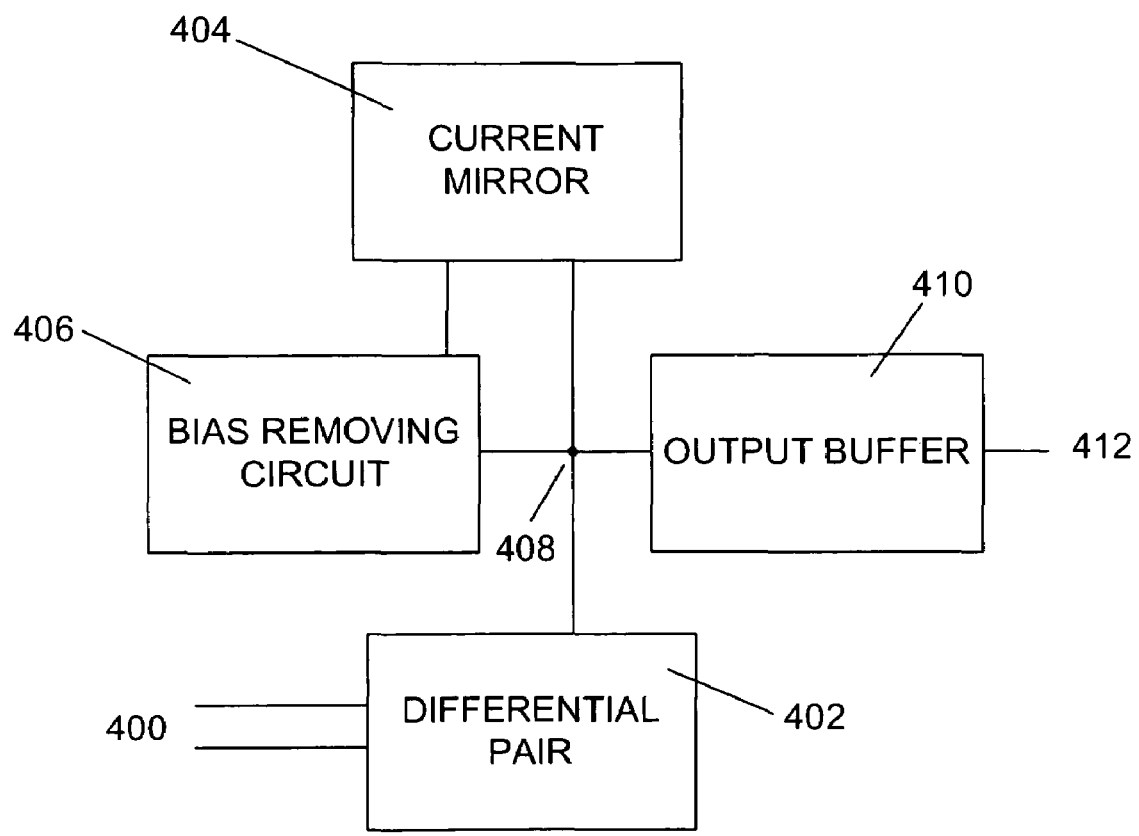
FIG. 4 is a system block diagram of an exemplary embodiment of the zero-bias-current level shifting circuit provided in FIG. 2.

FIG. 4 provides a block diagram of an exemplary embodiment of the zero-bias power level switching circuit. Circuit block 404, a current mirror, is communicatively coupled to a differential pair of transistors 402 with differential inputs 400. The coupling of current mirror 404 and the differential pair 402 produces the voltage-level-shifting function desired between input voltage 400 and output voltage 408 to be buffered by buffer 410. Output buffer 410 buffers the output 408 so that the current mirror 404 and differential pair 402 are not loaded by circuitry present on the buffered output 412. The bias removing circuit 406 senses that the output 408 has achieved a steady state condition, and removes the bias from the current mirror 404 to achieve substantially zero bias power in the steady state condition.

A battery-operated application, for example, would consume substantially zero static power. Again, there will be some small amount of leakage current, but generally, bias currents are orders of magnitude larger then leakage current. Although the circuits have been shown using MOSFET transistors, other types of transistors could also be used. The exemplary embodiment has been illustrated with input voltage rails of 1.2V and output voltage rails of 3.3V. However, one of ordinary skill in the art would understand that the circuits disclosed herein are applicable to translating signals between many other voltage levels as well. This disclosure is not limited to an embodiment for a 1.2V to 3.3V translation. The circuit concepts apply for any level translator where: 1) two or more voltage levels of operation are required; 2) two or more transistor types are required to accommodate the different voltage levels; and 3) the transistor types possess overlapping ranges of operation.

It should be emphasized that the above-described embodiments of the present disclosure, particularly, any "preferred" or "exemplary" embodiments, are merely possible examples of implementations, merely set forth for a clear understanding of the principles of the disclosure. Many variations and modifications may be made to the above-described embodiment(s) of the disclosure without departing substantially from the spirit and principles of the disclosure. All such modifications and variations are intended to be included herein within the scope of this disclosure and the present disclosure and protected by the following claims.

Therefore, having thus described the invention, at least the following is claimed:

1. A system for voltage level shifting comprising:
   an input buffer with first supply voltage rails and an input voltage;
   an output buffer with second supply voltage rails;
   a current mirror with a high-side supply of the second supply voltage rails, wherein current mirror comprises a first p-channel MOSFET diode-connected and a second p-channel MOSFET, and the sources of each of the first and second p-channel MOSFETS are communicatively coupled with the high-side supply of the second supply voltage rails;
   a differential set of transistors with a low side supply of the first supply voltage rails; and
   a latching circuit for removing bias signal, wherein the latching circuit for a removing bias signal comprises:
      a bias setting buffer inverter with the second supply voltage rails;
      a third D-channel MOSFET with the source communicatively coupled with the high side supply of the second supply voltage rails, the drain communicatively coupled with the input of the bias setting buffer inverter, and the gate communicatively coupled with the output of the bias setting buffer inverter; and
      a third n-channel MOSFET with the drain communicatively coupled with the drain of the first p-channel MOSFET, the source communicatively coupled with the drain of the first n-channel MOSFET, and the gate communicatively coupled with the output of the bias setting buffer inverter;
   wherein a bias signal of the current mirror.

2. The system of claim 1, wherein
   the input buffer includes a pair of differential outputs;
   the differential set of transistors comprises a first n-channel MOSFET with the drain communicatively coupled with the low-side supply of the second supply voltage rails and a second n-channel MOSFET with the drain communicatively coupled with the low side supply of the second supply voltage rails; and
   the first differential output of the input buffer is communicatively coupled with the gate of the first n-channel MOSFET and the second differential output of the input buffer is communicatively coupled with the gate of the second n-channel MOSFET.

3. The system of claim 1, wherein the latching circuit for removing a bias signal disconnects a supply current path after a switching threshold is achieved.

4. The system of claim 3, wherein the latching circuit for removing a bias signal further stabilizes internal nodes to increase noise immunity.

5. The system of claim 1, wherein the latching circuit for removing bias signal disconnects a supply current path after a switching threshold is achieved.

6. The system of claim 5, wherein the latching circuit for removing a bias signal further stabilizes internal nodes to increase noise immunity.

7. The system of claim 1, wherein
   the input to the bias setting buffer is communicatively coupled with the drain of the second n-channel MOSFET, the drain of the second p-channel MOSFET, and the drain of the third p-channel MOSFET; and
   the output of the bias setting buffer inverter is communicatively coupled with the gate of the third p-channel MOSFET and the gate of the third n-channel MOSFET.

8. A system for voltage level shifting comprising:
   an input buffer with first supply voltage rails and an input voltage;
   an output buffer with second supply voltage rails;
   a current mirror with a high-side supply of the second supply voltage rails, wherein the current mirror comprises a first transistor and a second transistor;
   a differential set of transistors with a low side supply of the first supply voltage rails, wherein the differential set of transistors comprises a third transistor; and
   a latching circuit for removing a bias signal, wherein the latching circuit for a removing bias signal comprises:
      a bias setting buffer inverter with the second supply voltage rails;
      a fifth transistor with the supply terminal communicatively coupled with the high side supply of the second supply voltage rails, the output terminal communicatively coupled with the input of the bias setting buffer inverter, and the control terminal communicatively coupled with the output of the bias setting buffer inverter; and
      a sixth transistor with the supply terminal communicatively coupled with the output terminal of the first transistor, the output terminal communicatively coupled with the supply terminal of the third transistor, and the control terminal communicatively coupled with the output of the bias setting buffer inverter;
   wherein a bias signal of the current mirror; is removed after the voltage at an output has achieved a steady state condition, wherein
      the current mirror comprises a first transistor diode-connected and a second transistor; and
      the sources of each of the first and second transistors are communicatively coupled with the high-side supply of the second supply voltage rails.

9. The system of claim 8, wherein
   the input buffer has a pair of differential outputs;
   the third transistor of the differential set of transistors comprises an output terminal communicatively coupled with the low-side supply of the second supply voltage rails and a fourth transistor with an output terminal communicatively coupled with the low side supply of the second supply voltage rails; and
   the first differential output of the input buffer is communicatively coupled with a control terminal of the third transistor and the second differential output of the input buffer is communicatively coupled with a control terminal of the fourth transistor.

10. The system of claim 8, wherein the latching circuit for removing a bias signal disconnects a supply current path after a switching threshold is achieved.

11. The system of claim 10, wherein the latching circuit for removing a bias signal further stabilizes internal nodes to increase noise immunity.

12. The system of claim 8, wherein the latching circuit for removing a bias signal disconnects a supply current path after a switching threshold is achieved.

13. The system of claim 12, wherein the latching circuit for removing a bias signal further stabilizes internal nodes to increase noise immunity.

14. The system of claim 8, wherein the input to the bias setting buffer inverter is communicatively coupled with the supply terminal of the fourth transistor, the output terminal of the second transistor, and the output terminal of the fifth transistor; and the output of the bias setting buffer inverter is communicatively coupled with the control terminal of the fifth transistor and the control terminal of the sixth transistor.

* * * * *

UNITED STATES PATENT AND TRADEMARK OFFICE
CERTIFICATE OF CORRECTION

| | | |
|---|---|---|
| PATENT NO. | : 7,205,819 B2 | Page 1 of 1 |
| APPLICATION NO. | : 11/042009 | |
| DATED | : April 17, 2007 | |
| INVENTOR(S) | : Davis | |

It is certified that error appears in the above-identified patent and that said Letters Patent is hereby corrected as shown below:

Please replace col. 7, line 44 with the following line:

wherein a bias signal of the current mirror is removed after the voltage at an output has achieved a steady state condition.

Signed and Sealed this

Twenty-first Day of August, 2007

JON W. DUDAS
*Director of the United States Patent and Trademark Office*